(12) United States Patent
Kitada

(10) Patent No.: US 11,906,373 B2
(45) Date of Patent: Feb. 20, 2024

(54) PRESSURE SENSOR AND ELECTRONIC EQUIPMENT

(71) Applicant: Murata Manufacturing Co., Ltd., Nagaokakyo (JP)

(72) Inventor: Hiroaki Kitada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 886 days.

(21) Appl. No.: 16/705,758

(22) Filed: Dec. 6, 2019

(65) Prior Publication Data

US 2020/0109995 A1    Apr. 9, 2020

Related U.S. Application Data

(63) Continuation of application No. PCT/JP2018/027418, filed on Jul. 23, 2018.

(30) Foreign Application Priority Data

Jul. 26, 2017    (JP) ................................ 2017-144110

(51) Int. Cl.
*G01L 1/16*       (2006.01)
*G06F 3/041*      (2006.01)
(Continued)

(52) U.S. Cl.
CPC ............. *G01L 1/16* (2013.01); *G06F 3/0414* (2013.01); *H10N 30/302* (2023.02); *H10N 30/87* (2023.02); *H10N 30/883* (2023.02)

(58) Field of Classification Search
CPC ....... G01L 1/16; G06F 3/0414; H01L 41/047; H01L 41/0533; H01L 41/1132; H01L 41/081
(Continued)

(56) References Cited

U.S. PATENT DOCUMENTS 4,954,811 A    9/1990    Chatigny et al.
5,578,766 A    11/1996   Kondo
(Continued)

FOREIGN PATENT DOCUMENTS

CN    105556267 A    5/2016
JP    S5799140 U     6/1982
(Continued)

OTHER PUBLICATIONS

International Search Report issued in PCT/JP2018/027418, dated Oct. 9, 2018.
(Continued)

*Primary Examiner* — Octavia Davis Hollington
(74) *Attorney, Agent, or Firm* — ArentFox Schiff LLP

(57) ABSTRACT

A pressure sensor that includes a piezoelectric film having a first main surface and a second main surface, a first electrode on the first main surface of the piezoelectric film, and a second electrode on the second main surface of the piezoelectric film. At least one of the first electrode and the second electrode is formed of a material having an elastic modulus of 60 GPa or more, and the product of a thickness of the at least one of the first electrode and the second electrode in a stacking direction of the pressure sensor multiplied by an elastic modulus of the at least one of the first electrode and the second electrode is 4 MPa·m or more.

20 Claims, 8 Drawing Sheets

(51) Int. Cl.
*H10N 30/87* (2023.01)
*H10N 30/30* (2023.01)
*H10N 30/88* (2023.01)

(58) Field of Classification Search
USPC .................................................. 73/862.625
See application file for complete search history.

(56) References Cited

U.S. PATENT DOCUMENTS

| 10,309,844 | B2 | 6/2019 | Kawamura | |
| 2013/0344364 | A1 | 12/2013 | Nanaumi et al. | |
| 2016/0092016 | A1* | 3/2016 | Yoshida | G01L 1/16 345/174 |
| 2016/0169753 | A1 | 6/2016 | Kawamura | |

FOREIGN PATENT DOCUMENTS

| JP | H03214062 | * | 9/1991 | |
| JP | H0634454 | A | 2/1994 | |
| JP | H07280672 | A | 10/1995 | |
| JP | H08201424 | A | 8/1996 | |
| JP | 2005156531 | A | 6/2005 | |
| JP | 2007064649 | * | 3/2007 | |
| JP | 2011043442 | A | 3/2011 | |
| JP | 2011059281 | A | 3/2011 | |
| JP | 2011185681 | A | 9/2011 | |
| JP | 2012138194 | A | 7/2012 | |
| JP | 2014202491 | * | 10/2014 | |
| JP | 2015046072 | A | 3/2015 | |
| JP | 2017058344 | A | 3/2017 | |
| WO | 2008013049 | A1 | 1/2008 | |
| WO | WO-2015080109 | A1 * | 6/2015 | ............... G01L 1/16 |
| WO | WO2016136522 | * | 9/2016 | |

OTHER PUBLICATIONS

Written Opinion of the International Searching Authority issued in PCT/JP2018/027418, dated Oct. 9, 2018.

* cited by examiner

PRODUCT OF THICKNESS IN STACKING
DIRECTION OF FIRST ELECTRODE
MULTIPLIED BY ELASTIC MODULE (MPa·m)

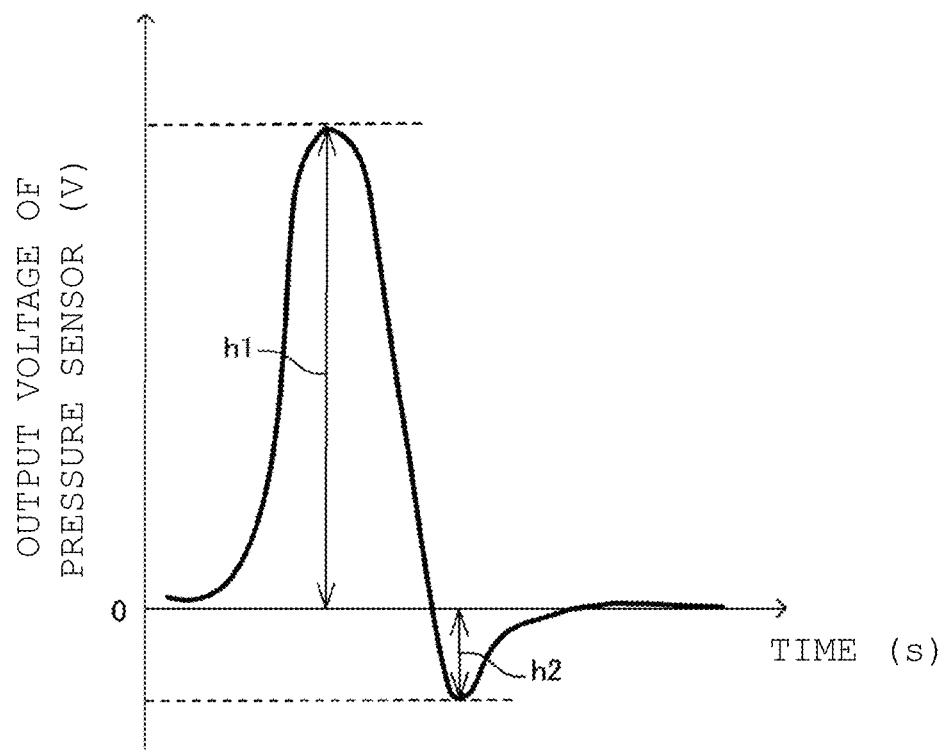
FIG. 10 - PRIOR ART

PRESSURE SENSOR AND ELECTRONIC EQUIPMENT

CROSS REFERENCE TO RELATED APPLICATIONS

The present application is a continuation of International application No. PCT/JP2018/027418, filed Jul. 23, 2018, which claims priority to Japanese Patent Application No. 2017-144110, filed Jul. 26, 2017, the entire contents of each of which are incorporated herein by reference.

FIELD OF THE INVENTION

An embodiment of the present invention relates to a pressure sensor that senses pressing and electronic equipment that uses the pressure sensor.

BACKGROUND OF THE INVENTION

There has been proposed a touch sensor panel that uses fluororesin to have smaller electrode resistance as compared with a touch sensor panel using an ITO film so as to facilitate and ensure an increase in size of the panel (see Patent Document 1).

Patent Document 1: Japanese Patent Application Laid-Open No. 2015-46072

SUMMARY OF THE INVENTION

In the touch sensor panel of Patent Document 1, metal used as an electrode has an elastic modulus of 60 GPa or more, which is sufficiently high, but has a small thickness, thereby lacking rigidity to an extent that the shape cannot be maintained by itself. Therefore, in cases where a pressure sensor is incorporated into the touch sensor panel of Patent Document 1, when a material having a low elastic modulus, e.g., a cushion or an adhesive, is used in a position where the pressure sensor is mounted, output with a polarity opposite to user operation is generated due to stress relaxation as illustrated in FIG. 10. For example, after a plus voltage (plus-side maximum output value: h1), which is normal output, is detected, a minus voltage (minus-side maximum output value: h2), which is generated due to stress relaxation, is detected. Accordingly, a problem, e.g., a reduction in sensor sensitivity, occurs.

Therefore, it is an object of an embodiment of the present invention to provide a pressure sensor that hardly generates output with an opposite polarity due to stress relaxation and has increased sensor sensitivity, and electronic equipment containing such a pressure sensor.

A pressure sensor of an embodiment of the present invention includes a piezoelectric film having a first main surface and a second main surface, a first electrode on the first main surface of the piezoelectric film, and a second electrode on the second main surface of the piezoelectric film. At least one of the first electrode and the second electrode is formed of a material having an elastic modulus of 60 GPa or more, and the product of the thickness of the at least one of the first electrode and the second electrode in a stacking direction of the pressure sensor multiplied by the elastic modulus of the at least one of the first electrode and the second electrode is 4 Mpa·m or more.

With this configuration, the pressure sensor has a predetermined or higher rigidity, making it easy to maintain the shape by itself. Thus, even when the pressure sensor is used together with a material having a low elastic modulus, e.g., a cushion or an adhesive, stress relaxation hardly occurs. Accordingly, the pressure sensor hardly generates output with an opposite polarity due to stress relaxation, and the sensor sensitivity can be increased.

Electronic equipment of an embodiment of the present invention includes the aforementioned pressure sensor and a substrate having an elastic modulus of 1 MPa or less.

With this configuration, in the electronic equipment, the pressure sensor has a predetermined or higher rigidity. Therefore, even when used in a state where the pressure sensor is attached to a substrate having an elastic modulus of 1 Mpa or less, the pressure sensor is hardly subject to influences of the substrate. Accordingly, the electronic equipment hardly generates output with an opposite polarity due to stress relaxation, and the sensor sensitivity can be increased.

The pressure sensor of an embodiment of the present invention hardly generates output with an opposite polarity due to stress relaxation, and the sensor sensitivity can be increased.

BRIEF EXPLANATION OF THE DRAWINGS

FIG. 10 is a view for explaining influences of stress relaxation on sensor output voltage in a conventional pressure sensor.

DETAILED DESCRIPTION OF THE INVENTION

Electronic equipment and a pressure sensor according to an embodiment of the present invention are described below.

Figure 1A:
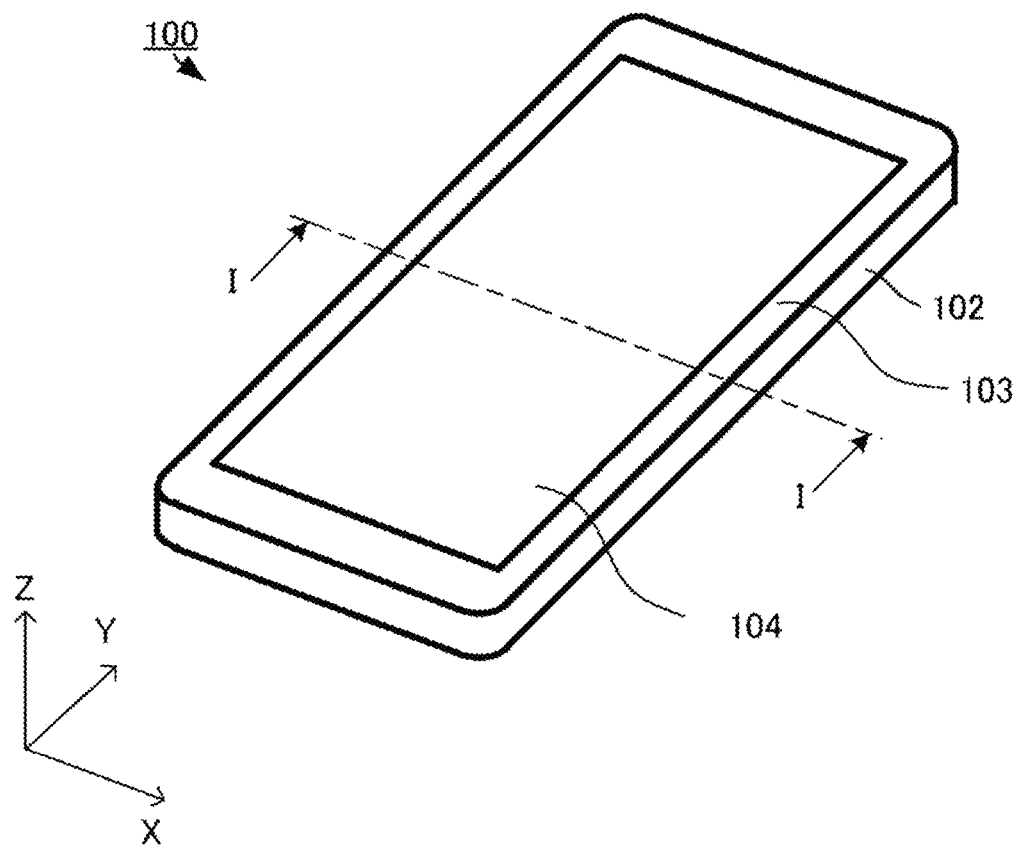
FIG. 1(A) is a perspective view of electronic equipment including a pressure sensor according to a first embodiment.
Figure 1B:
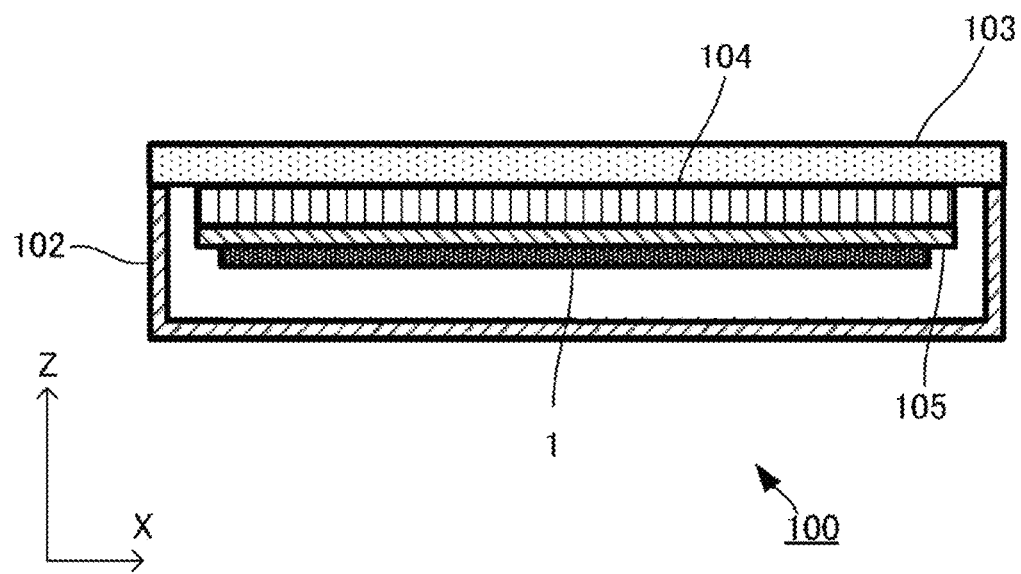
FIG. 1(B) is a cross-sectional view thereof.
Figure 2A:
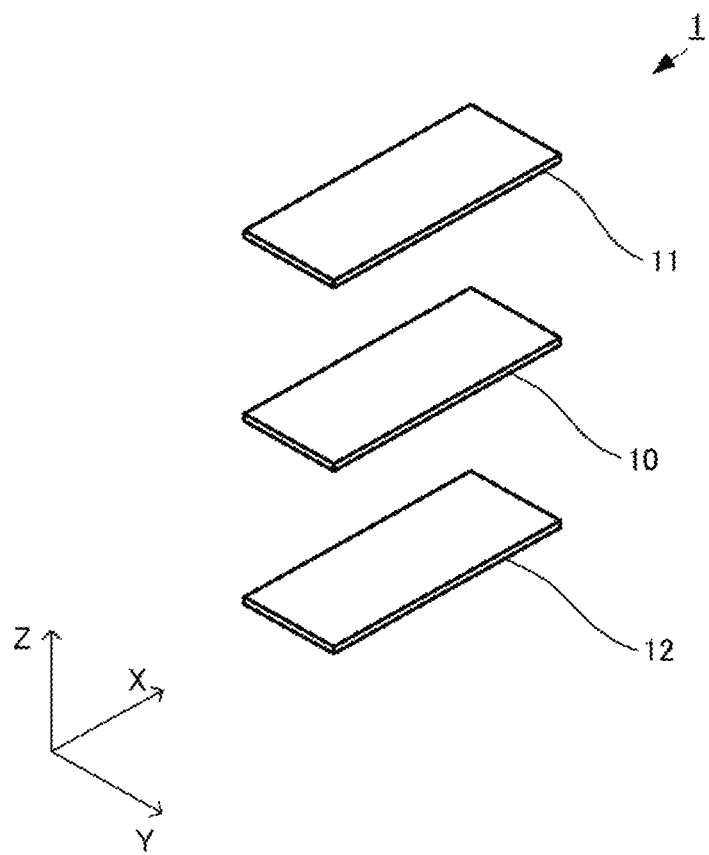
FIG. 2(A) is an exploded perspective view of the pressure sensor according to the first embodiment.
Figure 2B:
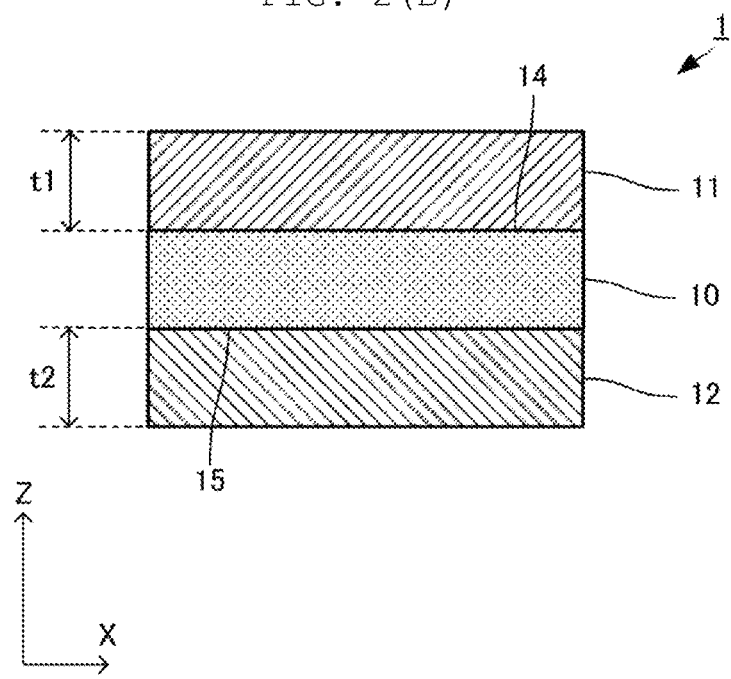
FIG. 2(B) is a schematic view for explaining a cross-section thereof.
Figure 3:
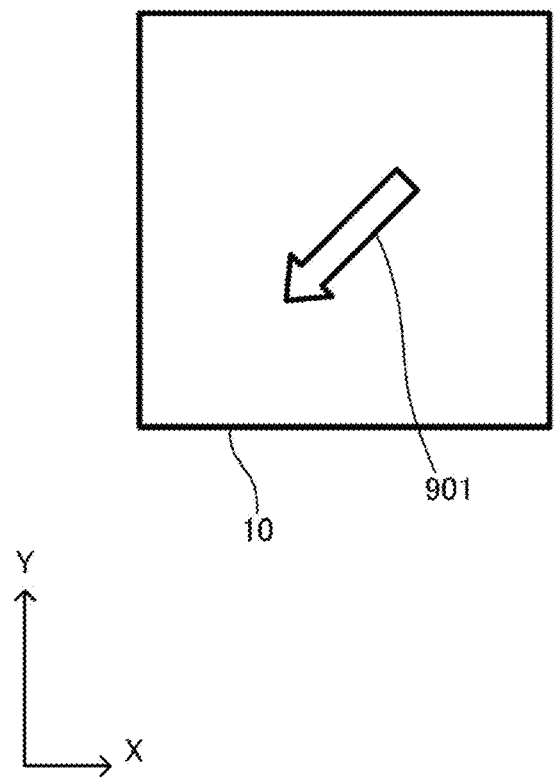
FIG. 3 is a view for explaining a piezoelectric film according to the first embodiment.

FIG. 1(A) is a perspective view of electronic equipment including a pressure sensor according to a first embodiment of the present invention, and FIG. 1(B) is a cross-sectional view thereof. FIG. 2(A) is an exploded perspective view of the pressure sensor according to the first embodiment, and FIG. 2(B) is a schematic view for explaining a cross-section thereof. FIG. 3 is a view for explaining a piezoelectric film according to the first embodiment. Note that the electronic equipment illustrated in FIG. 1(A) is a mere example and is not limitative, but may be changed appropriately depending on the specification. Moreover, in the drawings, wires or the like are omitted for the sake of convenience of description.

As illustrated in FIG. 1(A), electronic equipment 100 includes a housing 102 having a substantially rectangular parallelepiped shape having a cavity in an upper surface. The electronic equipment 100 includes a surface panel 103 having a flat plate shape arranged to seal the cavity of the upper surface of the housing 102. The surface panel 103 functions as an operation surface on which a user performs touch operation using a finger, a pen, or the like. The width direction (lateral direction) of the housing 102 is the X direction, the length direction (longitudinal direction) is the Y direction, and the thickness direction is the Z direction in the description below.

As illustrated in FIG. 1(B), the electronic equipment 100 includes, on an inner side of the housing 102, a display portion 104, a cushion material 105, and a pressure sensor 1. The pressure sensor 1, the cushion material 105, and the display portion 104 are stacked in this order from an inner side to an outer side of the housing 102. The display portion 104 is formed on a surface of the surface panel 103 on an inner side of the housing 102.

The cushion material 105 is formed below the display portion 104 in the Z direction inside the housing 102. The pressure sensor 1 is formed below the display portion 104 in the Z direction with the cushion material 105 interposed therebetween. Note that the cushion material 105 corresponds to a "substrate" in the present disclosure.

The cushion material 105 has an elastic modulus of 1 Mpa or less. Therefore, the cushion material 105 is easily deformed when subject to an external force. When the user performs touch operation on the surface panel 103 using a finger, a pen, or the like, the pressing force is transmitted to the pressure sensor 1 via the cushion material 105. As will be described later, the pressure sensor 1 outputs a potential corresponding to the operation the surface panel 103 has received.

As illustrated in FIGS. 2(A) and 2(B), the pressure sensor 1 includes a piezoelectric film 10, a first electrode 11, and a second electrode 12. Note that, in FIGS. 2(A) and 2(B), illustrations of those other than the piezoelectric film 10, the first electrode 11, and the second electrode 12 are omitted.

The piezoelectric film 10 includes a first main surface 14 and a second main surface 15. Similar to the piezoelectric film 10, the first electrode 11 and the second electrode 12 are formed in a rectangular shape in a plan view. The first electrode 11 is provided on the first main surface 14 of the piezoelectric film 10. The second electrode 12 is provided on the second main surface 15 of the piezoelectric film 10.

It is favorable that, in a plan view of the pressure sensor 1, at least one of the first electrode 11 and the second electrode 12 entirely overlaps with the piezoelectric film 10 in a top view or is positioned on an inner side in a plane direction of the piezoelectric film 10. Thus, a short-circuit at an end of the first electrode 11 and the second electrode 12 can be suppressed.

FIG. 3 is a view of the piezoelectric film 10 in a plan view. As illustrated in FIG. 3, the piezoelectric film 10 may be a film formed of a chiral polymer. As the chiral polymer, in the first embodiment, polylactic acid (PLA), particularly poly-1-lactic-acid (PLLA) is used. A PLLA made of a chiral polymer has a helical structure in a main chain. The PLLA has piezoelectricity when the molecules are uniaxially drawn and oriented. Then, the uniaxially drawn PLLA generates voltage when the flat plate surface of the piezoelectric film 10 is pressed. In this case, the amount of voltage to be generated depends on the amount of displacement with which the flat plate surface is displaced by the amount of pressing in a direction perpendicular to the flat plate surface.

In the first embodiment, the axial drawing direction of the piezoelectric film 10 (PLLA) is, as indicated by arrow 901 in FIG. 3, a direction forming an angle of 45 degrees with respect to the Y direction and the Z direction. This 45 degrees includes, for example, an angle including about 45 degrees ±10 degrees. Thus, when the piezoelectric film 10 is pressed, voltage is generated.

The PLLA generates piezoelectricity through molecule orientation processing by drawing or the like, and therefore does not require polling processing, unlike other polymers, e.g., PVDF, and piezoelectric ceramics. In other words, the piezoelectricity of the PLLA that does not belong to the ferroelectric body is not developed by ionic polarization unlike a ferroelectric body, e.g., PVDF or PZT, but is derived from a helical structure, which is a characteristic structure of molecules. Therefore, in the PLLA, pyroelectricity that is generated by a different ferroelectric piezoelectric body does not occur. Because of the absence of pyroelectricity, influences of the temperature or frictional heat of the finger of the user do not occur, and therefore the pressure sensor 3 can be formed thinly. Furthermore, PVDF or the like shows a variation in piezoelectric constant over time and, in some cases, the piezoelectric constant is considerably reduced, but the piezoelectric constant of the PLLA is very stable over time. Accordingly, without being influenced by surrounding environments, the displacement by pressing can be detected with high sensitivity.

Note that the piezoelectric film 10 may be made of a film formed of an ion-polarized ferroelectric body, e.g., PVDF or PZT which has been subject to polling processing, instead of the PLLA.

For the first electrode 11 and the second electrode 12 formed on both main surfaces of the piezoelectric film 10, a metal-based electrode, e.g., aluminum or copper, may be used. Moreover, when the electrode requires transparency, for the first electrode 11 and the second electrode 12, a material having high transparency, e.g., ITO or PEDOT, may be used. When such first electrode 11 and second electrode 12 are provided, a charge generated by the piezoelectric film 10 can be acquired as voltage, and a pressing amount detection signal of a voltage value depending on the amount of pressing can be output to the outside.

Figure 4:
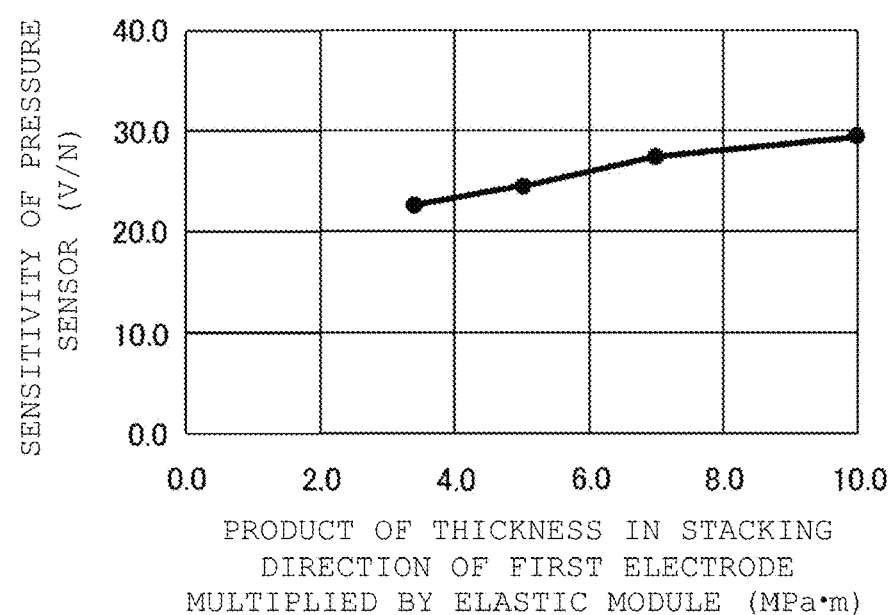
FIG. 4 is a graph indicating a relationship between a product of a thickness in a stacking direction multiplied by an elastic modulus of a first electrode according to the first embodiment and the sensitivity of the pressure sensor according to the first embodiment.
Figure 5:
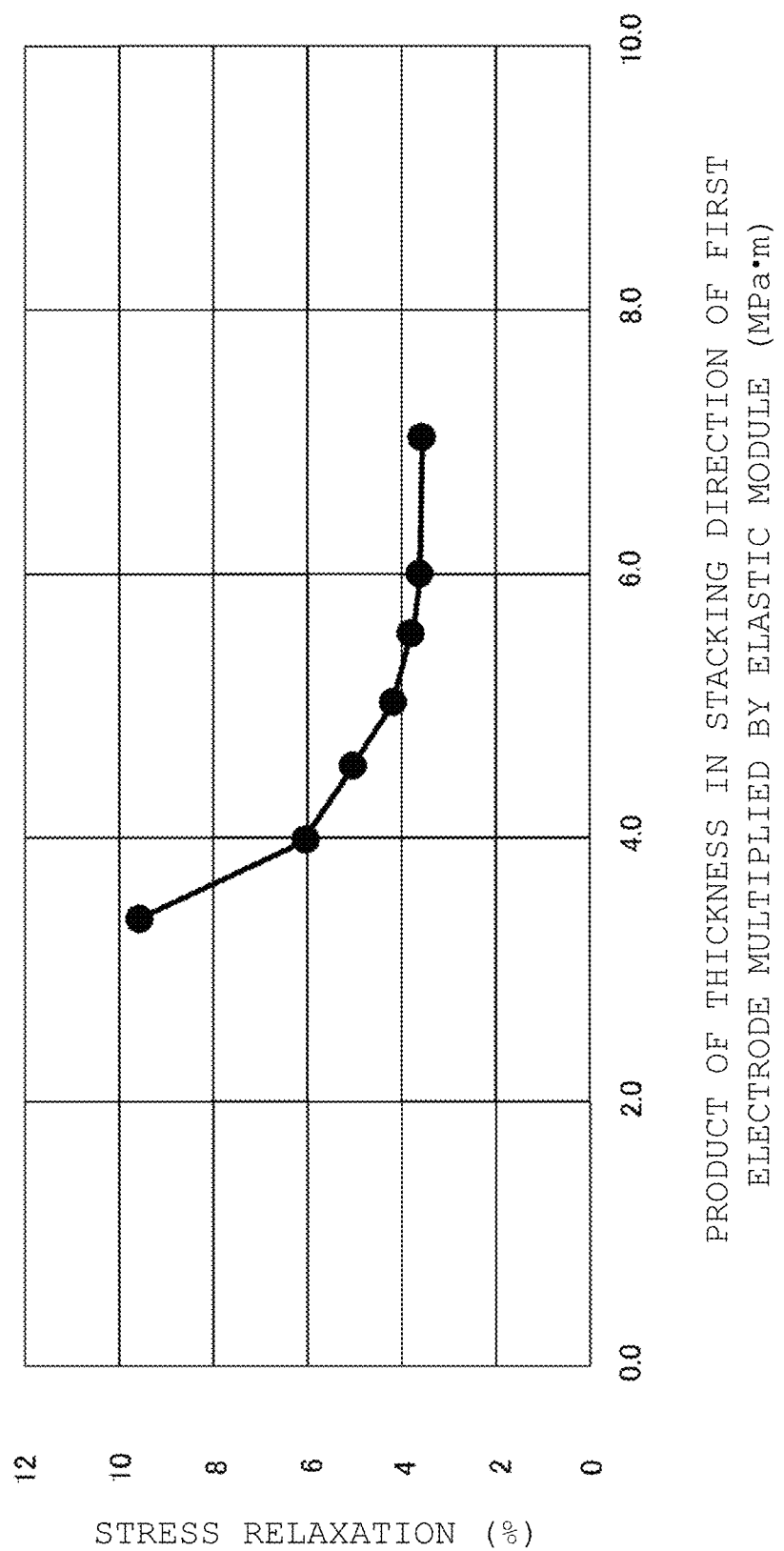
FIG. 5 is a graph indicating a relationship between a product of a thickness in a stacking direction multiplied by an elastic modulus of a first electrode according to the first embodiment and the stress relaxation of the pressure sensor according to the first embodiment.

FIG. 4 is a graph indicating a relationship between a product of a thickness in a stacking direction multiplied by an elastic modulus of the first electrode and the sensitivity of the pressure sensor. FIG. 5 is a graph indicating a relationship between a product of a thickness in a stacking direction multiplied by an elastic modulus of the first electrode and the stress relaxation of the pressure sensor.

As illustrated in FIG. 4, the product of the thickness in the stacking direction of the first electrode 11 multiplied by the elastic modulus is in a relationship of direct proportion to the sensitivity of the pressure sensor 1. That is, an increase in the product of a thickness t1 in the stacking direction of the first electrode 11 multiplied by the elastic modulus increases the sensitivity of the pressure sensor 1.

In FIG. 5, the stress relaxation is defined as a ratio of the plus voltage (plus-side maximum output value), which is normal output, to the minus voltage (minus-side maximum output value), which is generated by the stress relaxation after the normal output is detected. For example, in FIG. 10, it is calculated as stress relaxation (%)=h2/h1×100.

As illustrated in FIG. 5, when the product of the thickness in the stacking direction of the first electrode 11 multiplied by the elastic modulus is 4 Mpa·m or more, the stress relaxation of the pressure sensor 1 can be suppressed to low levels. Meanwhile, when the product of the thickness in the stacking direction of the first electrode 11 multiplied by the elastic modulus is less than 4 Mpa·m, the stress relaxation of the pressure sensor 1 becomes large and tends to influence the output of the pressure sensor 1.

When the product of the thickness in the stacking direction of the first electrode 11 multiplied by the elastic modulus is 4 Mpa·m or more, the stress relaxation can be as small as 6% or less. Preferably, the product of the thickness in the stacking direction of the first electrode 11 multiplied by the elastic modulus is 4.5 MPa·m or more, and in this case the stress relaxation can be as small as 5% or less. Further preferably, when the product of the thickness in the stacking direction of the first electrode 11 multiplied by the elastic modulus is 5 MPa·m or more, even when the thickness in the stacking direction of the first electrode 11 and the elastic modulus are somewhat varied, the influences of a variation in stress relaxation can be small.

Here, the first electrode 11 is formed of a material having an elastic modulus of 60 GPa or more. Examples of the material having an elastic modulus of 60 GPa or more include metal, e.g., copper, having an elastic modulus of about 100 GPa. Moreover, the product of the thickness t1 in the stacking direction of the first electrode 11 multiplied by the elastic modulus is 4 Mpa·m or more. Thus, the first electrode 11 has a predetermined or higher rigidity. Therefore, the pressure sensor 1 generally has a predetermined or higher rigidity such that the shape is easily maintained by itself and the stress relaxation is suppressed to a low level.

Note that, instead of the first electrode 11, the second electrode 12 may be formed of a material having an elastic modulus of 60 GPa or more, and the product of the thickness t2 in the stacking direction of the second electrode 12 multiplied by the elastic modulus may be 4 MPa·m or more. Similarly, in this way, because the pressure sensor 1 generally has a predetermined or higher rigidity, the same effect can be obtained. Moreover, the first electrode 11 and the second electrode 12 may have the same configuration. Thus, because the first electrode 11 and the second electrode 12 both have a predetermined or higher rigidity, the same effect can be obtained. That is, it is sufficient if at least one of the first electrode 11 and the second electrode 12 satisfies the aforementioned condition, or both the first electrode 11 and the second electrode 12 may satisfy the aforementioned condition.

Moreover, the thickness t1 in the stacking direction of the first electrode 11 or the thickness t2 in the stacking direction of the second electrode 12 is preferably 200 μm or less. Thus, it is possible to adapt to the case where a reduction in size or a reduction in thickness of the electronic equipment 100 is demanded.

When the surface panel 103 receives a pressing operation, the pressing force is transmitted to the pressure sensor 1 via the cushion material 105. Thus, the flat plate surface of the piezoelectric film 10 of the pressure sensor 1 is pressed. The piezoelectric film 10 outputs a potential corresponding to the operation received on the surface panel 103. At this time, the elastic modulus of the cushion material 105 is relatively low, but the pressure sensor 1 has a predetermined or higher rigidity such that the shape is easily maintained by itself and the stress relaxation hardly occurs. Accordingly, the pressure sensor 1 hardly generates output with an opposite polarity due to the stress relaxation. Thus, the sensor sensitivity of the pressure sensor 1 is increased.

Figure 6:
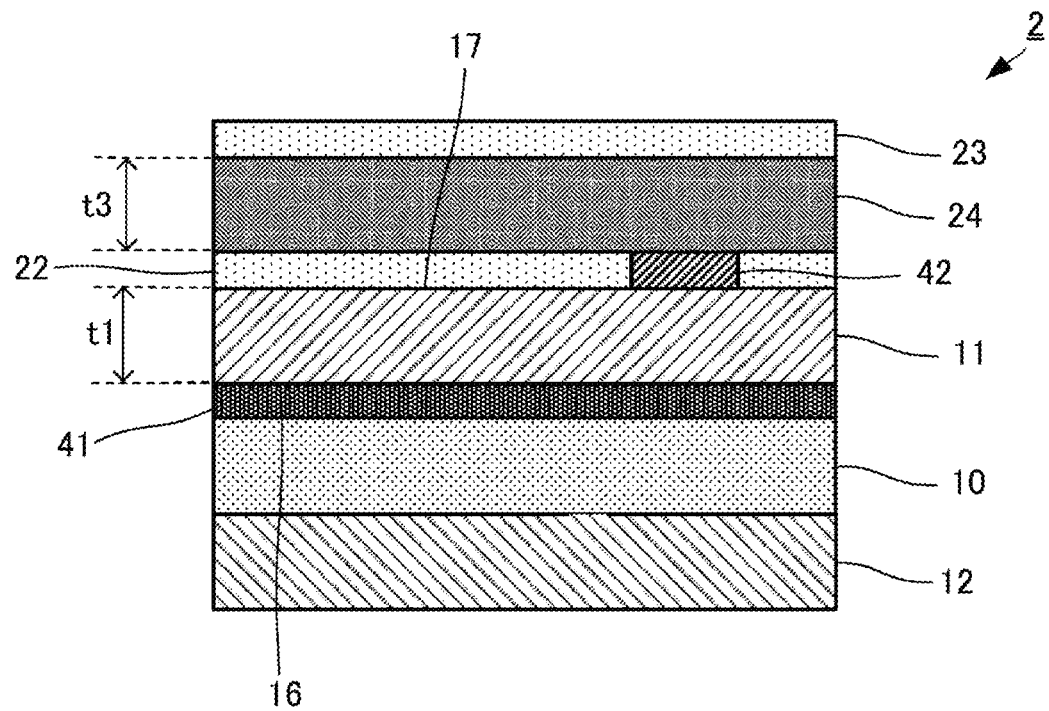
FIG. 6 is a schematic view for explaining a cross-section of a pressure sensor according to a second embodiment.

A pressure sensor according to a second embodiment is described below. FIG. 6 is a schematic view for explaining a cross-section of the pressure sensor according to the second embodiment. Note that, in FIG. 6, illustrations of wires or the like are omitted. As illustrated in FIG. 6, a pressure sensor 2 largely differs from the pressure sensor 1 according to the first embodiment in that the pressure sensor 2 further includes a shield electrode 24. Therefore, regarding the pressure sensor 2, points different from the pressure sensor 1 are described and the same points are not described.

The pressure sensor 2 further includes the shield electrode 24 with respect to the pressure sensor 1.

Moreover, the pressure sensor 2 further includes a first resin substrate 22, a second resin substrate 23, an adhesive tape 41, and a via electrode 42.

The first electrode 11 includes a third main surface 16 facing the piezoelectric film 10 and a fourth main surface 17 opposite from the third main surface 16. The first electrode 11 is, at the third main surface 16, bonded to the piezoelectric film 10 with the adhesive tape 41. The shield electrode 24 is arranged to face the fourth main surface 17 of the first electrode 11. Note that the adhesive tape 41 corresponds to a "bonding material" of the present invention.

The adhesive tape 41 preferably has an elastic modulus of 10 MPa or more. When the adhesive tape 41 has an elastic modulus of 10 MPa or more, even when the elastic modulus of the adhesive tape 41 is changed by temperature change, output of the pressure sensor 2 does not change much. Thus, the temperature characteristics of the pressure sensor 2 can be improved. Moreover, when the adhesive tape 41 has a high elastic modulus, even when the elastic modulus of the adhesive tape 41 is somewhat changed by temperature change, such change is negligible. For example, when the adhesive tape 41 has an elastic modulus of 10 MPa or more, the adhesive tape 41 is less likely to be influenced by the stress relaxation in the adhesive tape 41 itself. Thus, the stress relaxation characteristics of the pressure sensor 2 are maintained without being deteriorated.

The first resin substrate 22 and the second resin substrate 23 are formed on both main surfaces of the shield electrode 24 across the shield electrode 24. The first resin substrate 22 is arranged to be in contact with the fourth main surface 17 of the first electrode 11 and the shield electrode 24. The second resin substrate 23 is formed on a side of the shield electrode 24 where the first resin substrate 22 is not formed. The via electrode 42 is formed in a part of the first resin substrate 22 so as to extend through the first resin substrate 22.

The first resin substrate 22, the second resin substrate 23, the shield electrode 24, the via electrode 42, and the first electrode 11 are formed of a printed wiring board. Therefore, the first resin substrate 22, the second resin substrate 23, the shield electrode 24, the via electrode 42, and the first electrode 11 are easy to form. Note that the pressure sensor 2 may be structured not to include the second resin substrate 23. In this case, the shield electrode 24, the via electrode 42, and the first electrode 11 are formed of a printed wiring board on both surfaces of the first resin substrate 22. Thus, the pressure sensor 2 can be further reduced in thickness. Moreover, the first resin substrate 22 and the second resin substrate 23 include at least one of epoxy resin, polyimide, or a liquid crystal polymer.

The shield electrode 24 is formed of a material having an elastic modulus of 60 GPa or more. Thus, when the surface panel 103 receives pressing operation, the shield electrode 24, which has a predetermined or higher rigidity, can be deformed similarly.

In the shield electrode 24, the product of the thickness t3 in the stacking direction multiplied by the elastic modulus is 4 Mpa·m or more. Thus, the shield electrode 24 has the predetermined or higher rigidity. Therefore, the pressure sensor 2 generally has the predetermined or higher rigidity, and the shape can easily be maintained by itself, and the stress relaxation can be suppressed low. Moreover, the thickness t1 in the stacking direction of the first electrode 11 can be formed thinly. Thus, the first electrode 11 can be formed as a thin wire, enabling formation of a more complex pattern. Thus, the reception circuit of the pressure sensor 2 or other circuits are easily formed on the same surface as the first electrode 11. Accordingly, it is possible to easily form a sensor module including the pressure sensor 2 and other circuits, or a module including multi-functions.

Moreover, it is preferable that the shield electrode 24 be provided on the display portion 104 side in the electronic equipment 100. That is, the shield electrode 24 is positioned between the first electrode 11 and the second electrode 12, and the display portion 104. Thus, it is possible to suppress noise from the display portion 104, i.e., from the outside.

Figure 7:
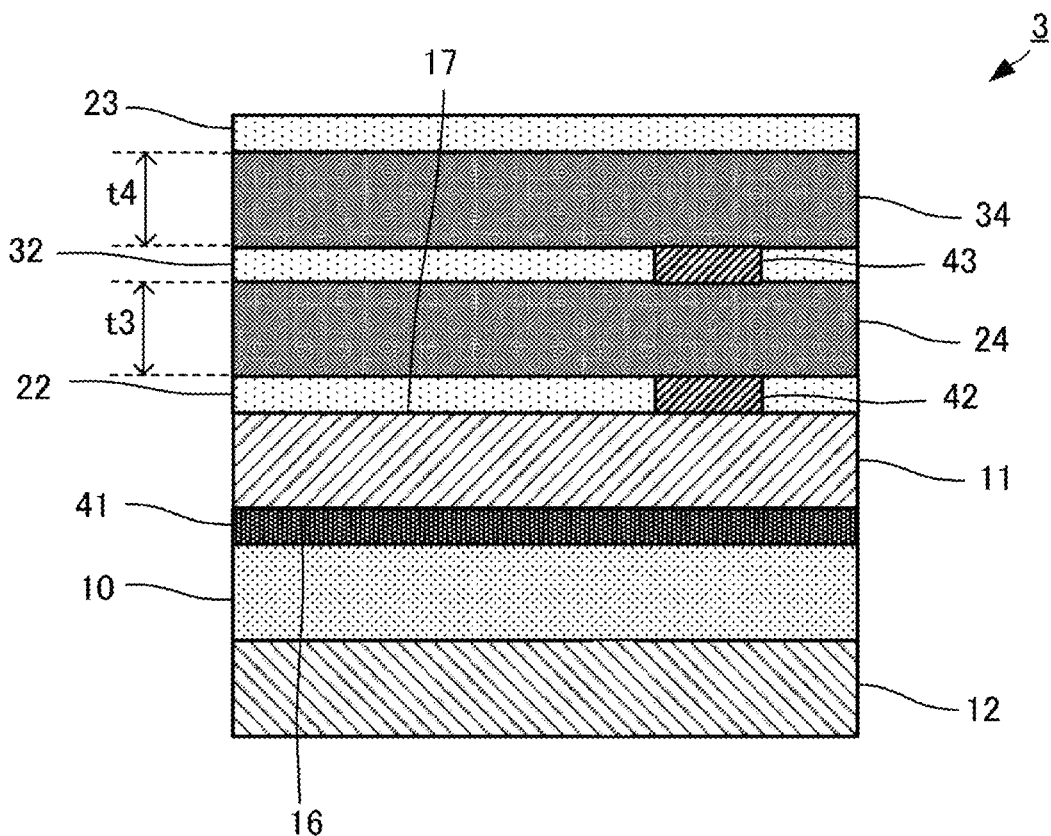
FIG. 7 is a schematic view for explaining a cross-section of a pressure sensor according to a third embodiment.

A pressure sensor according to a third embodiment is described below. FIG. 7 is a schematic view for explaining a cross-section of the pressure sensor according to the third embodiment. Note that, in FIG. 7, illustrations of wires or the like are omitted. As illustrated in FIG. 7, the pressure sensor 3 largely differs from the pressure sensor 2 according to the second embodiment in that a shield electrode is formed in a plurality of electrode layers. Therefore, regarding the pressure sensor 3, points different from the pressure sensor 2 are described, and the same points are not described.

The pressure sensor 3 includes, as a shield electrode, a shield electrode 24 and a shield electrode 34. The pressure sensor 3 further includes a third resin substrate 32 and a via electrode 43. The shield electrode 34, the third resin substrate 32, and the via electrode 43 are provided between the shield electrode 24 and the second resin substrate 23 of the pressure sensor 2. That is, the shield electrode 34 is further stacked and formed on the shield electrode 24. Moreover, the shield electrode 34 and the via electrode 43, similar to the shield electrode 24 or the like, can easily be formed of a printed wiring board.

The sum of the product of the thickness t3 in the stacking direction of the shield electrode 24 multiplied by the elastic modulus and the product of the thickness t4 in the stacking direction of the shield electrode 34 multiplied by the elastic modulus is 4 Mpa·m or more. Therefore, the pressure sensor 3 generally has a predetermined or higher rigidity such that the shape can easily be maintained by itself and the stress relaxation is suppressed low. Moreover, the pressure sensor 3 includes a plurality of printed wiring board layers. Therefore, the degree of freedom of arrangement or wiring in forming a sensor module that includes the pressure sensor 3 and other circuits or a module that includes multi-functions is increased, enabling a reduction in size.

Figure 8:
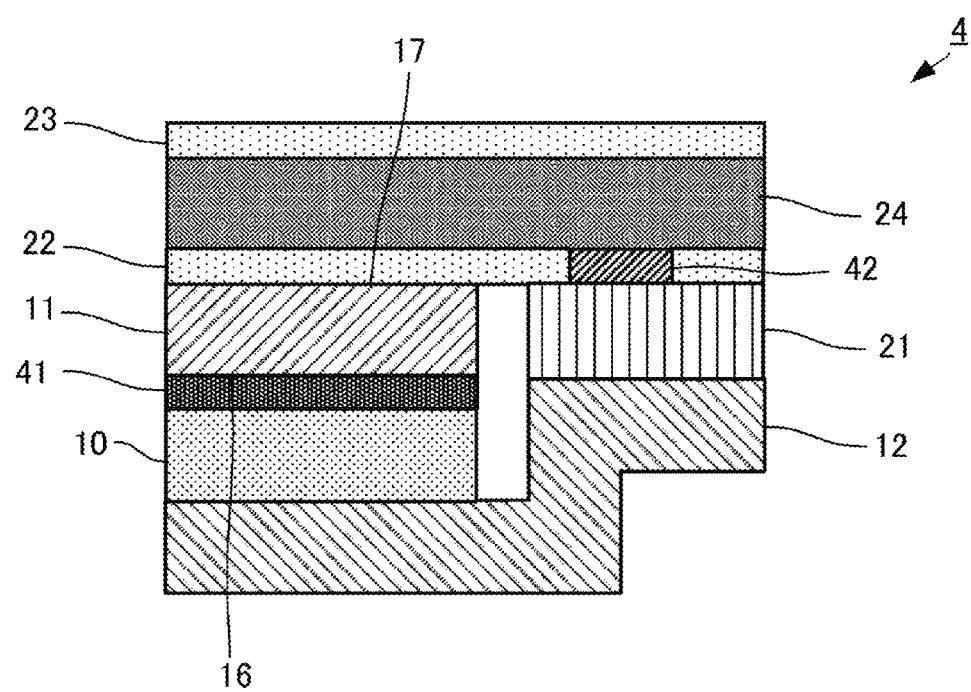
FIG. 8 is a schematic view for explaining a cross-section of a pressure sensor according to a fourth embodiment.

A pressure sensor according to a fourth embodiment is described below. FIG. 8 is a schematic view for explaining a cross-section of the pressure sensor according to the fourth embodiment. Note that, in FIG. 8, illustrations of wires or the like are omitted. As illustrated in FIG. 8, the pressure sensor 4 largely differs from the pressure sensor 2 according to the second embodiment in that the second electrode 12 is formed of a conductive tape. Therefore, regarding the pressure sensor 4, points different from the pressure sensor 2 are described, and the same points are not described.

The pressure sensor 4 includes a reference electrode pattern 21. The reference electrode pattern 21 is arranged in the same plane as the first electrode 11. Here, the same plane as the first electrode 11 indicates a plane perpendicular to the stacking direction. Therefore, the reference electrode pattern 21 and the first electrode 11 are arranged so as not to contact with each other, but contact the first resin substrate 22 separately. The reference electrode pattern 21 is, similar to the first electrode 11, formed of a printed wiring board.

The via electrode 42 is formed in the first resin substrate 22 in a position facing the reference electrode pattern 21. The via electrode 42 connects the shield electrode 24 and the reference electrode pattern 21.

In the pressure sensor 4, the second electrode 12 is a reference electrode. The second electrode 12 is formed of a conductive tape. The second electrode 12 is connected to the reference electrode pattern 21. That is, in the pressure sensor 4, the first electrode 11 functions as a HOT electrode, and the reference electrode pattern 21 functions as a reference electrode. Thus, because the second electrode 12 can easily be attached to the reference electrode pattern 21, which is a reference electrode, the pressure sensor 4 is easy to manufacture. Moreover, because both sides of the first electrode 11, which is a HOT electrode, the third main surface 16 and the fourth main surface 17, are covered with the reference electrodes, noise from the outside can be suppressed.

The second electrode 12 is preferably a double-sided tape. Thus, another member, e.g., a cushion or a protective film, may be further attached to the second electrode 12 side of the pressure sensor 4.

Figure 9A:
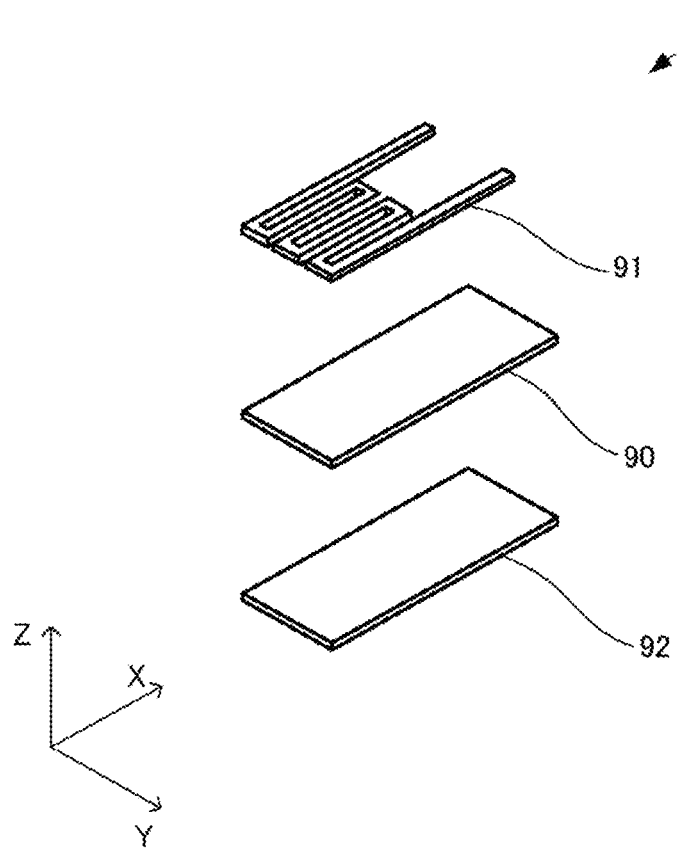
FIG. 9(A) is an exploded perspective view of a pressure sensor according to a variation.
Figure 9B:
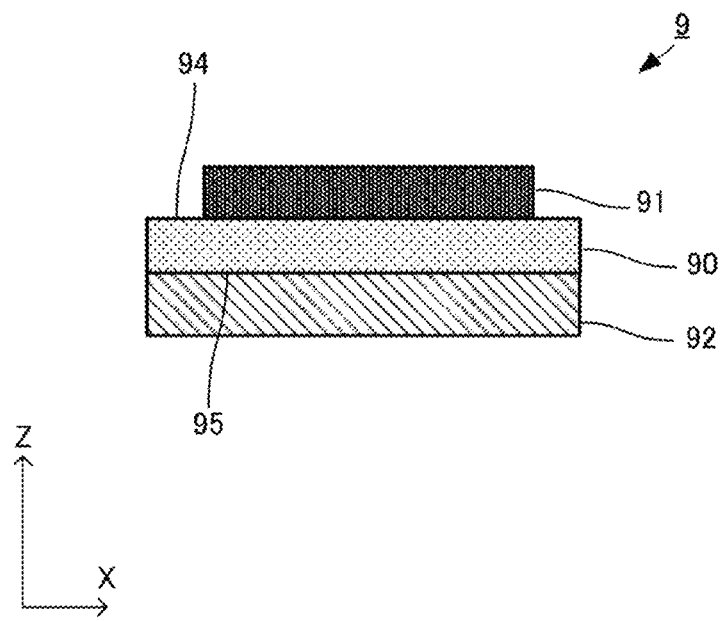
FIG. 9(B) is a schematic view for explaining a cross-section thereof.

Note that the pressure sensor is not limited to a piezoelectric sensor, but may be a strain gauge sensor. FIG. 9(A) is an exploded perspective view of a strain gauge sensor according to a variation, and FIG. 9(B) is a schematic view for explaining a cross-section thereof. As illustrated in FIGS. 9(A) and 9(B), a strain gauge sensor 9 includes a substrate 90, a first electrode 91, and a second electrode 92. Note that, in FIGS. 9(A) and 9(B), illustrations other than the substrate 90, the first electrode 91, and the second electrode 92 are omitted. Moreover, regarding the strain gauge sensor 9, points different from the pressure sensor 1 are described and the same points are not described.

A first electrode 91 is formed in a so-called zig-zag shape. A substrate 90 includes a first main surface 94 and a second main surface 95. The first electrode 91 is provided on the first main surface 94 of the substrate 90. The second electrode 92 is provided on the second main surface 95 of the substrate 90. Note that, although it is not necessary to always provide the second electrode 92, when the second electrode 92 is provided as a shield electrode, noise from the outside can be suppressed.

When the product of the thickness in the stacking direction of the first electrode 91 multiplied by the elastic modulus is 4 Mpa·m or more or when the product of the thickness in the stacking direction of the second electrode 92 multiplied by the elastic modulus is 4 Mpa·m or more, the stress relaxation of the strain gauge sensor 9 can be suppressed low.

Finally, the descriptions of the aforementioned embodiments should be considered to be illustrative, but not limitative in every respect. The scope of the present invention is indicated not by the aforementioned embodiments, but by the claims. Furthermore, the scope of the present invention includes the claims and equivalents.

DESCRIPTION OF REFERENCE SYMBOLS 1, 2, 3, 4: Pressure sensor
10: Piezoelectric film
11: First electrode
12: Second electrode
14: First main surface
15: Second main surface
16: Third main surface
17: Fourth main surface
21: Reference electrode pattern
22, 23, 32: Resin substrate
24, 34: Shield electrode
41: Bonding material
42, 43: Via electrode
100: Electronic equipment

The invention claimed is:

1. A pressure sensor comprising:
a piezoelectric film having a first main surface and a second main surface;
a first electrode on the first main surface of the piezoelectric film; and
a second electrode on the second main surface of the piezoelectric film,
wherein
at least one of the first electrode and the second electrode is formed of a material having an elastic modulus of 60 GPa or more, and a product of a thickness of the least one of the first electrode and the second electrode in a stacking direction of the pressure sensor multiplied by the elastic modulus of the least one of the first electrode and the second electrode is 4 MPa*m or more.

2. The pressure sensor according to claim 1, wherein both the first electrode and the second electrode are each formed of the material having the elastic modulus of 60 GPa or more, and each of the product of the thickness of the first electrode multiplied by the elastic modulus of the first electrode and the product of the thickness of the second electrode multiplied by the elastic modulus of the second electrode is 4 MPa*m or more.

3. The pressure sensor according to claim 1, wherein each of the product of the thickness of the first electrode multiplied by the elastic modulus of the first electrode and the product of the thickness of the second electrode multiplied by the elastic modulus of the second electrode is 5 MPa*m or more.

4. The pressure sensor according to claim 1, wherein the product of the thickness of the least one of the first electrode and the second electrode in the stacking direction multiplied by the elastic modulus of the least one of the first electrode and the second electrode is 5 MPa*m or more.

5. The pressure sensor according to claim 1, wherein the first electrode includes:
a third main surface facing the piezoelectric film; and
a fourth main surface opposite the third main surface; and
the pressure sensor further comprises a shield electrode arranged so as to face the fourth main surface,
the shield electrode is formed of a second material having an elastic modulus of 60 GPa or more, and
the shield electrode has a product of a thickness of the shield electrode in a stacking direction of the pressure sensor multiplied by the elastic modulus of the shield electrode is 4 MPa*m or more.

6. The pressure sensor according to claim 5, wherein the product of the thickness of the shield electrode in the stacking direction of the pressure sensor multiplied by the elastic modulus of the shield electrode is 5 MPa*m or more.

7. The pressure sensor according to claim 5, wherein
the shield electrode comprises a plurality of electrode layers, and
a sum of products of thicknesses of the plurality of electrode layers in the stacking direction of the pressure sensor multiplied by elastic moduli of the plurality of electrode layers is 4 MPa*m or more.

8. The pressure sensor according to claim 7, wherein the sum of the products of thicknesses of the plurality of electrode layers in the stacking direction of the pressure sensor multiplied by the elastic moduli of the plurality of electrode layers is 5 MPa*m or more.

9. The pressure sensor according to claim 7, further comprising:
a resin substrate between the shield electrode and the first electrode; and
a via electrode connecting the shield electrode and first electrode.

10. The pressure sensor according to claim 9, wherein the resin substrate, the shield electrode, the via electrode, and the first electrode are formed of a printed wiring board, and
the resin substrate includes at least one of epoxy resin, polyimide, and a liquid crystal polymer.

11. The pressure sensor according to claim 7, further comprising:
a resin substrate between the shield electrode and the first electrode;
a reference electrode pattern arranged in a same plane as the first electrode; and
a via electrode connecting the shield electrode and the reference electrode pattern,
wherein
the second electrode is formed of a conductive tape and is connected to the reference electrode pattern.

12. The pressure sensor according to claim 11, wherein
the resin substrate, the shield electrode, the via electrode, the reference electrode pattern, and the first electrode are formed of a printed wiring board, and
the resin substrate includes at least one of epoxy resin, polyimide, and a liquid crystal polymer.

13. The pressure sensor according to claim 11, wherein the conductive tape is a double-sided tape.

14. The pressure sensor according to claim 5, further comprising:
a resin substrate between the shield electrode and the first electrode; and
a via electrode connecting the shield electrode and first electrode.

15. The pressure sensor according to claim 14, wherein
the resin substrate, the shield electrode, the via electrode, and the first electrode are formed of a printed wiring board, and
the resin substrate includes at least one of epoxy resin, polyimide, and a liquid crystal polymer.

16. The pressure sensor according to claim 5, further comprising:
a resin substrate between the shield electrode and the first electrode;
a reference electrode pattern arranged in a same plane as the first electrode; and
a via electrode connecting the shield electrode and the reference electrode pattern, wherein
the second electrode is formed of a conductive tape and is connected to the reference electrode pattern.

17. The pressure sensor according to claim 16, wherein
the resin substrate, the shield electrode, the via electrode, the reference electrode pattern, and the first electrode are formed of a printed wiring board, and
the resin substrate includes at least one of the epoxy resin, polyimide, and a liquid crystal polymer.

18. The pressure sensor according to claim 16, wherein the conductive tape is a double-sided tape.

19. The pressure sensor according to claim 1, further comprising a bonding material bonding the piezoelectric film to the first electrode,
wherein the bonding material has an elastic modulus of 10 MPa or more.

20. Electronic equipment comprising:
a substrate having an elastic modulus of 1 MPa or less; and
a pressure sensor bonded to the substrate, the pressure sensor comprising:
a piezoelectric film having a first main surface and a second main surface;
a first electrode on the first main surface of the piezoelectric film; and
a second electrode on the second main surface of the piezoelectric film,
wherein
at least one of the first electrode and the second electrode is formed of a material having an elastic modulus of 60 GPa or more, and a product of a thickness of the least one of the first electrode and the second electrode in a stacking direction of the pressure sensor multiplied by the elastic modulus of the least one of the first electrode and the second electrode is 4 MPa*m or mroe.

* * * * *